US009978443B2

(12) United States Patent
Yang et al.

(10) Patent No.: US 9,978,443 B2
(45) Date of Patent: *May 22, 2018

(54) METHOD OF CONTROLLING AUXILIARY BRANCHES FOR SRAM CELL

(71) Applicant: TAIWAN SEMICONDUCTOR MANUFACTURING COMPANY LTD., Hsinchu (TW)

(72) Inventors: Chen-Lin Yang, Hsinchu County (TW); Ming-Chien Tsai, Kaohsiung (TW); Chung-Yi Wu, Hsinchu County (TW); Cheng Hung Lee, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days. days.

This patent is subject to a terminal disclaimer.

(21) Appl. No.: 14/994,707

(22) Filed: Jan. 13, 2016

(65) Prior Publication Data
US 2016/0125934 A1   May 5, 2016

Related U.S. Application Data

(62) Division of application No. 14/059,022, filed on Oct. 21, 2013, now Pat. No. 9,263,122.

(51) Int. Cl.
*G11C 11/419*   (2006.01)
*G11C 8/16*   (2006.01)
*G11C 11/412*   (2006.01)

(52) U.S. Cl.
CPC .............. *G11C 11/419* (2013.01); *G11C 8/16* (2013.01); *G11C 11/412* (2013.01)

(58) Field of Classification Search
CPC ........ G11C 11/419; G11C 8/16; G11C 11/412
USPC ..................... 365/154, 156, 230.05; 257/903
See application file for complete search history.

(56) References Cited

U.S. PATENT DOCUMENTS

| | | | | |
|---|---|---|---|---|
| 5,304,874 A * | 4/1994 | Vinal | ..................... | G11C 11/419 327/215 |
| 5,966,319 A * | 10/1999 | Sato | ........................ | G11C 11/41 365/154 |
| 6,034,886 A * | 3/2000 | Chan | ....................... | G11C 14/00 365/154 |
| 6,353,552 B2 * | 3/2002 | Sample | ................. | G11C 7/1006 365/154 |
| 6,510,076 B1 * | 1/2003 | Lapadat | .............. | G11C 11/4125 365/154 |
| 7,570,537 B2 * | 8/2009 | Bhatia | ................... | G11C 11/412 365/154 |

(Continued)

*Primary Examiner* — Vu Le
*Assistant Examiner* — Sung Cho
(74) *Attorney, Agent, or Firm* — WPAT, P.C., Intellectual Property Attorneys; Anthony King (57) ABSTRACT

A method includes: during a read operation of a first storage node and a second storage node formed by cross-coupled inverters, based on data stored in the first storage node and the second storage node, causing a first auxiliary branch or a second auxiliary branch to assist a corresponding one of the cross-coupled inverters in holding data; and during a write operation of the first storage node and the second storage node, based on data to be written to the first storage node and the second storage node, causing the first auxiliary branch or the second auxiliary branch to assist a corresponding one of the cross-coupled inverters in flipping data.

20 Claims, 7 Drawing Sheets

(56) References Cited

U.S. PATENT DOCUMENTS

| | | | | |
|---|---|---|---|---|
| 8,345,504 B2* | 1/2013 | Chuang | ............... | G11C 11/413 |
| | | | | 365/154 |
| 8,451,652 B2* | 5/2013 | Seikh | ................. | G11C 11/413 |
| | | | | 365/154 |
| 2003/0090928 A1* | 5/2003 | Takemura | ............ | G11C 11/412 |
| | | | | 365/154 |
| 2003/0189221 A1* | 10/2003 | Takemura | ............ | G11C 11/412 |
| | | | | 257/200 |
| 2004/0174736 A1* | 9/2004 | Takemura | ............ | G11C 11/412 |
| | | | | 365/154 |
| 2006/0028888 A1* | 2/2006 | Shin | ....................... | G11C 7/06 |
| | | | | 365/205 |
| 2006/0152964 A1* | 7/2006 | Ramaraju | ............ | G11C 11/412 |
| | | | | 365/154 |
| 2006/0198181 A1* | 9/2006 | Luk | ..................... | G11C 11/413 |
| | | | | 365/154 |
| 2007/0002607 A1* | 1/2007 | Khellah | ................ | G11C 11/419 |
| | | | | 365/154 |
| 2007/0139997 A1* | 6/2007 | Suzuki | ................... | G11C 5/14 |
| | | | | 365/154 |
| 2007/0206404 A1* | 9/2007 | Yamagami | ............. | G11C 5/14 |
| | | | | 365/154 |
| 2008/0151604 A1* | 6/2008 | Suzuki | ................. | G11C 11/412 |
| | | | | 365/154 |
| 2008/0158939 A1* | 7/2008 | Chen | .................... | G11C 11/412 |
| | | | | 365/154 |
| 2012/0008376 A1* | 1/2012 | Hsu | ..................... | G11C 11/413 |
| | | | | 365/154 |
| 2012/0195111 A1* | 8/2012 | Ramaraju | ............... | G11C 8/16 |
| | | | | 365/156 |
| 2012/0243285 A1* | 9/2012 | Ngu | ....................... | G11C 8/16 |
| | | | | 365/63 |
| 2014/0063896 A1* | 3/2014 | Ahn | .................. | G11C 13/0064 |
| | | | | 365/145 |

* cited by examiner

METHOD OF CONTROLLING AUXILIARY BRANCHES FOR SRAM CELL

CROSS REFERENCE TO RELATED APPLICATIONS

This application claims the benefit of U.S. application Ser. No. 14/059,022, filed on Oct. 21, 2013, which is incorporated by reference in its entirety.

BACKGROUND

A static random access memory (SRAM) cell includes cross-coupled inverters configured to form a storage node and a complementary storage node, and pass gates to control access of the storage nodes, respectively. The pass gates are controlled by a word line and are configured to couple the storage node and the complementary storage node to a bit line and a complementary bit line, respectively, when the word line is asserted.

In some approaches, during a read operation of the SRAM cell, the word line is asserted, and based on data stored at the storage node and the complementary storage node, one of the bit line and complementary bit line discharges through the corresponding inverter for data sensing. During a write operation of the SRAM cell, the discharge of the bit line or complementary bit line is arranged to cause the voltage at the corresponding storage node to exceed the switching threshold of the inverter driven by the storage node to flip the stored data. When the read operation or the write operation is performed on the SRAM cell, each of other SRAM cells in the same row also experience a dummy read operation because the asserted word line also drives pass gates of each of the other SRAM cells.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAIL DESCRIPTION

Embodiments, or examples, of the disclosure illustrated in the drawings are now described using specific languages. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numbers may be repeated throughout the embodiments, but this does not necessarily require that feature(s) of one embodiment apply to another embodiment, even if they share the same reference number. It will be understood that when an element is referred to as being "connected to" or "coupled to" another element, it may be directly connected to or coupled to the other element, or intervening elements may be present.

In the below description, a signal is asserted with a logical high value to activate a corresponding device when the device is active high. In contrast, the signal is deasserted with a low logical value to deactivate the corresponding device. When the device is active low, however, the signal is asserted with a low logical value to activate the device, and is deasserted with a high logical value to deactivate the device.

Some embodiments have one or a combination of the following features and/or advantages. In some embodiments, the SRAM cell includes cross-coupled inverters, and auxiliary branches that assist one of the cross-coupled inverters in holding data during a read operation or a dummy read operation, and that assist one of the cross-coupled inverters in flipping data during a write operation. During the read operation or the dummy read operation, the inverter holding the data is assisted by the auxiliary branch, so that read disturb is unlikely to occur. Further, because during the write operation, the auxiliary branch for holding the data is not conducting while the auxiliary branch for flipping the data is conducting, write recovery time and write margin are improved.

Figure 1:
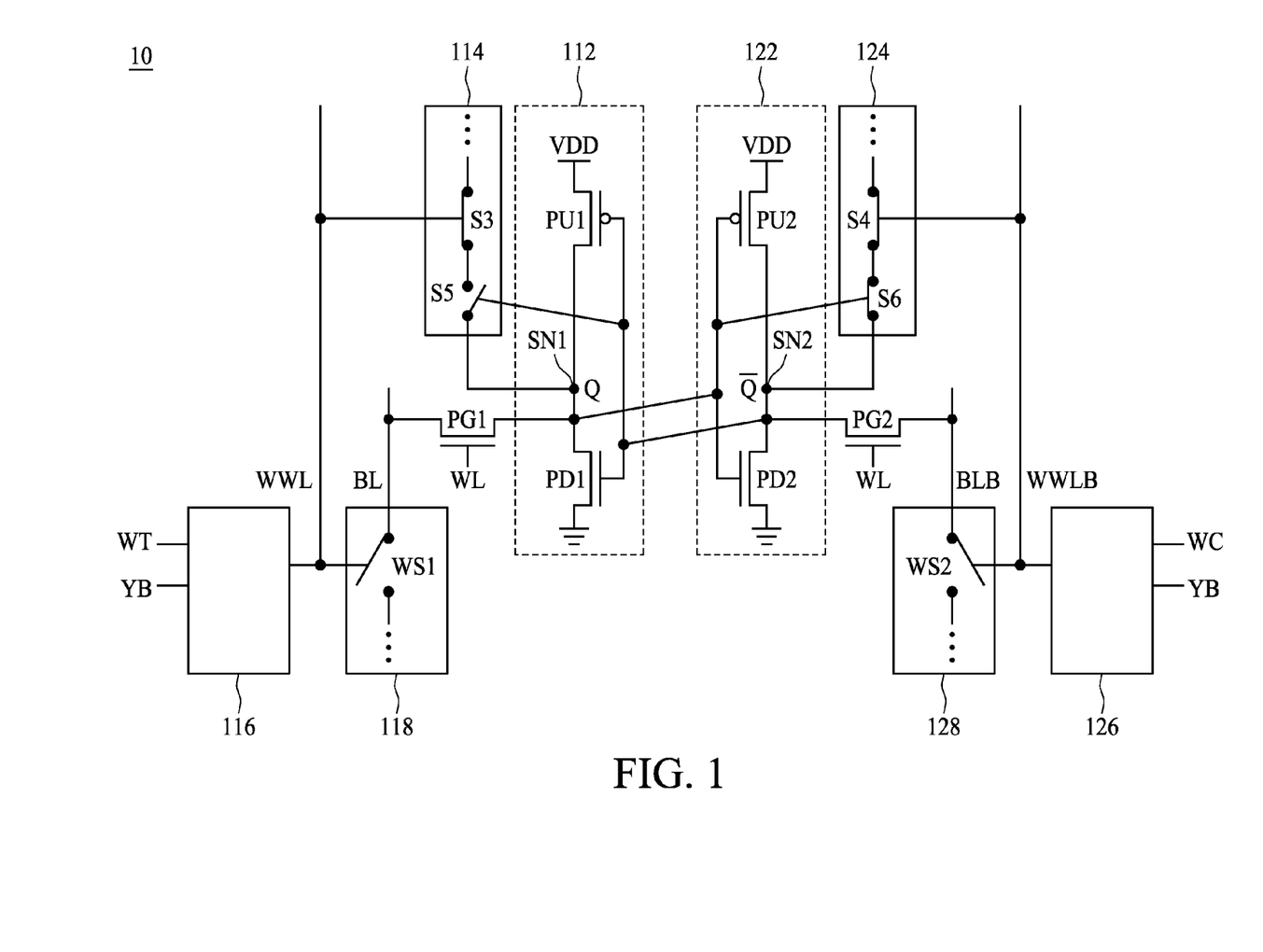
FIG. 1 is a schematic circuit diagram of a SRAM cell with data-controlled auxiliary branches during a read operation or a dummy read operation in accordance with some embodiments.

FIG. 1 is a schematic circuit diagram of a static random access memory (SRAM) cell 10 with data-controlled auxiliary branches and the associated control circuits during a read operation or a dummy read operation in accordance with some embodiments. The SRAM cell 10 includes inverters 112 and 122, auxiliary branches 114 and 124, control logic 116 and 126, pass gates PG1 and PG2, a bit line driver 118 and a complementary bit line driver 128. In some embodiments, the bit line driver 118 and the complementary bit line driver 128 are shared between SRAM cells in the same column.

The inverters 112 and 122 are cross-coupled and are configured to form a storage node SN1 and a storage node SN2 for storing differential data. In some embodiments, the inverter 112 includes a p-channel field effect transistor (pFET) PU1 and an n-channel FET (nFET) PD1. Gates of the pFET PU1 and nFET PD1 are coupled, drains of the pFET PU1 and nFET PD1 are coupled, and sources of the pFET PU1 and nFET PD1 are coupled to a supply rail VDD and a ground, respectively. Similarly, the inverter 122 includes a pFET PU2 and an nFET PD2. Gates of the pFET PU2 and nFET PD2 are coupled, drains of the pFET PU2 and nFET PD2 are coupled, and sources of the pFET PU2 and nFET PD2 are coupled to the supply rail VDD and the ground, respectively. The coupled drains of the pFET PU1 and the nFET PD1 form the storage node SN1 and drive the coupled gates of the pFET PU2 and the nFET PD2. The coupled drains of the pFET PU2 and the nFET PD2 form the storage node SN2 and drive the coupled gates of the pFET PU1 and the nFET PD1. Because data Q at the storage node SN1 is input to the inverter 122 to generate data $\overline{Q}$ stored at the storage node SN2, and data $\overline{Q}$ at the storage node SN2 is input to the inverter 112 to generate data Q stored at the storage node SN1, the data Q and $\overline{Q}$ are complementary to each other.

The auxiliary branches 114 and 124 are coupled to the storage node SN1 and the storage node SN2, respectively. In some embodiments, the auxiliary branch 114 includes a switch S3 and a switch S5 coupled in series between the storage node SN1 and the supply rail such as VDD. The switch S3 is in response to a signal through a write word line WWL. The switch S5 is in response to the data $\overline{Q}$ stored in the storage node SN2. Similarly, the auxiliary branch 124 includes a switch S4 and a switch S6 coupled in series between the storage node SN2 and the supply rail such as VDD. The switch S4 is in response to a signal through a complementary write word line WWLB. The switch S6 is in response to the data Q stored in the storage node SN1. In other embodiments, the switches in the auxiliary branch are arranged in a different order. For example, the switch S5 receiving the data in the storage node SN1 is arranged closer to the supply rail and the switch S3 receiving the signal through the write word line WWL is arranged closer to the storage node SN1.

The control logic 116 and 126 generate the signal to the write word line WWL and the signal to the complementary write word line WWLB, respectively. The control logic 116 generates the signal to the write word line WWL in response to a write data signal WT and a column select signal YB. The control logic 126 generates the complementary word line signal WWLB in response to a write data signal WC and the column select signal YB.

The pass gates PG1 is coupled between the storage node SN1 and the bit line BL, and the pass gate PG2 is coupled between the storage node SN2 and the complementary bit line BLB. The pass gates PG1 and PG2 are controlled by a word line WL. In some embodiments, the pass gate PG1 and the pass gate PG2 are implemented using nFETs.

The bit line driver 118 and the complementary bit line driver 128 driving the bit line BL and the complementary bit line BLB, respectively, are also controlled by the write word line WWL and the complementary word line WWLB. The bit line driver 118 includes a write switch WS1 coupled between the bit line BL and the supply rail such as ground. The complementary bit line driver 128 includes a write switch WS2 coupled between the complementary bit line BLB and the supply rail such as ground. A bit line or a complementary bit line is also called a data line or a complementary data line because bit line and the complementary bit line carries data for a corresponding SRAM cell.

Figure 2:
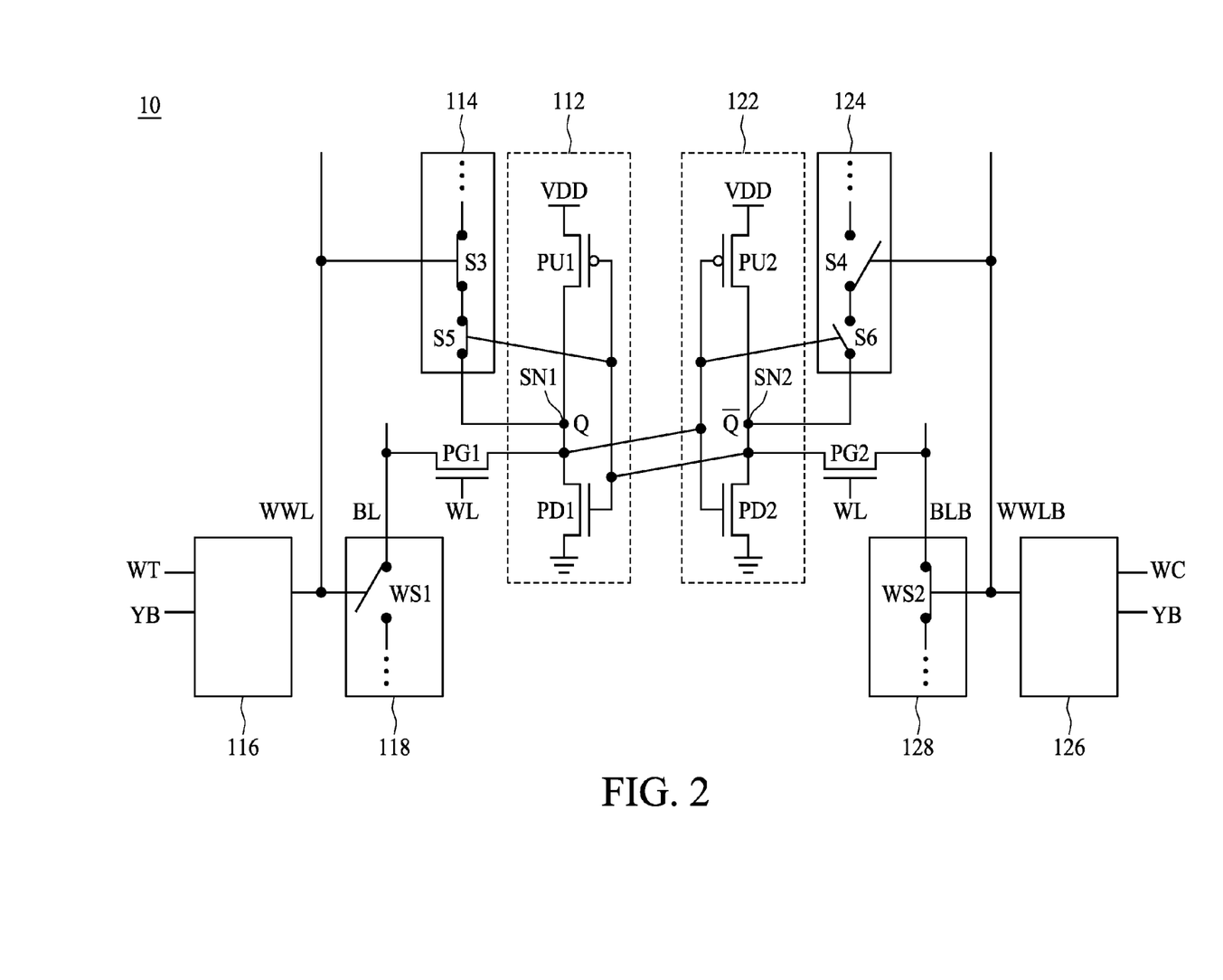
FIG. 2 is a schematic circuit diagram of the SRAM cell with data-controlled auxiliary branches during a write operation in accordance with some embodiments.
Figure 3:
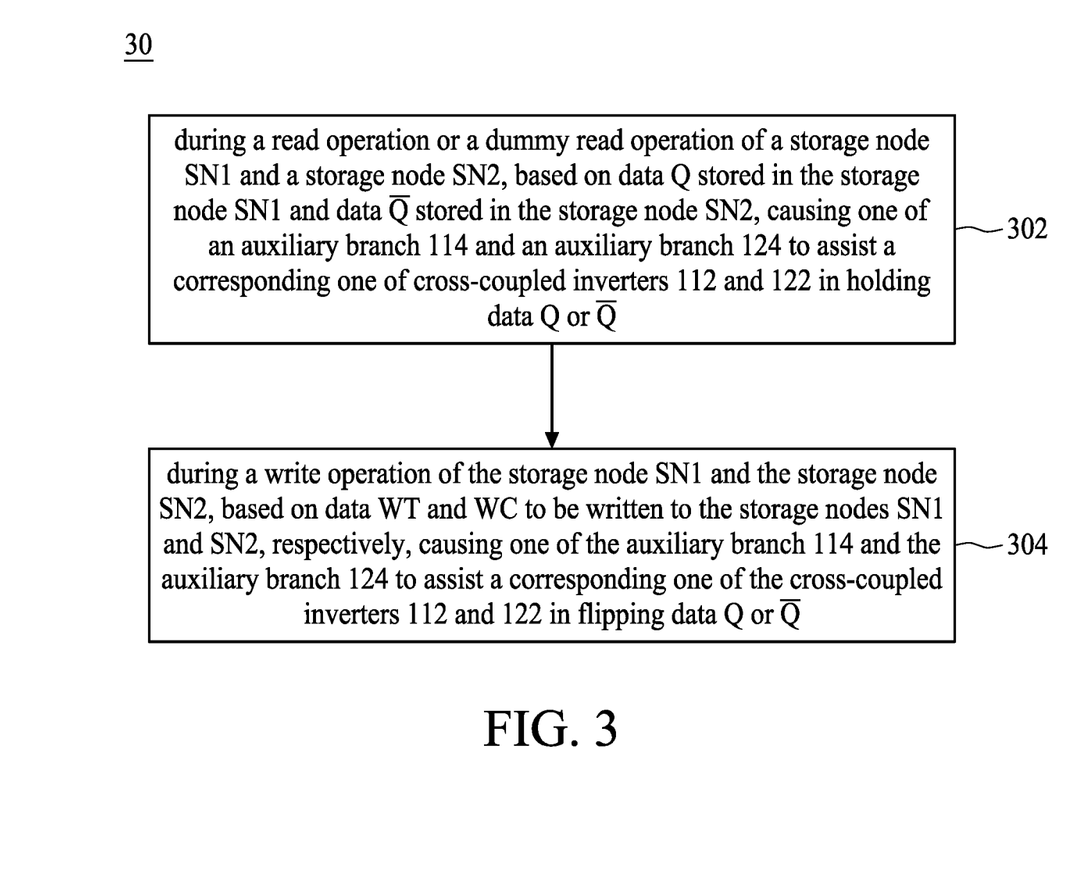
FIG. 3 is a flow chart of a method for applying the auxiliary branches in accordance with some embodiments.

FIG. 2 is a schematic circuit diagram of the SRAM cell 10 with data-controlled auxiliary branches during a write operation in accordance with some embodiments. The structure of the SRAM cell 10 in FIG. 3 is similar to that described with reference to FIG. 1 and is therefore omitted here. FIG. 1 and FIG. 2 illustrate different operations of the SRAM cell 10 which are described in further detail below.

FIG. 3 is a flow chart 30 of a method for applying the auxiliary branches in accordance with some embodiments. In operation 302, during a read operation or a dummy read operation of the storage node SN1 and the storage node SN2, based on data Q stored in the storage node SN1 and data $\overline{Q}$ stored in the storage node SN2, one of the auxiliary branch 114 and the auxiliary branch 124 is caused to assist a corresponding one of the cross-coupled inverters 112 and 122 in holding data Q or $\overline{Q}$.

During the read operation of the SRAM cell 10 illustratively shown in FIG. 1, the column select signal YB is asserted to reflect that a read or write operation is being performed on the column where the SRAM cell 10 resides. Upon receiving the asserted column select signal YB, the control logic 116 generates the signal applied to the write word line WWL based on the write data signal WT and the control logic 126 generates the signal applied to the complementary word line WWLB based on the write data signal WC. In some embodiments, both of the write data signal WT and the write data signal WC are of the same logic values such as the high logical values.

In some embodiments, when the read operation initiates, the bit line BL and the complementary bit line BLB has been precharged, such as to the logical high value, by a precharging circuitry (not shown). The signal to the write word line WWL is deasserted with respect to the write switch WS1 of the bit line driver 118, and therefore, the write switch WS1 does not couple the bit line BL to, for example, ground, and the bit line BL stays at the precharged level. The signal to the complementary word line WWLB is deasserted with respect to the write switch WS2 of the complementary bit line driver 128, and therefore, the write switch WS2 does not couple the complementary bit line BLB to, for example, ground, and the complementary bit line BLB stays at the precharged level. During the read operation, the word line WL is asserted such that the pass gates PG1 and PG2 couples the bit line BL and the complementary bit line BLB to the storage nodes SN1 and SN2, respectively.

Based on the write data signal WT, the signal through the write word line WWL is asserted with respect to the switch S3 in the auxiliary branch 114, and therefore turns on the switch S3. Based on the write data signal WC, the signal through the complementary word line WWLB is asserted with respect to the switch S4 in the auxiliary branch 124, and therefore turns on the switch S4. Based on the data Q and $\overline{Q}$ stored in the storage nodes SN1 and SN2, one of the switch S5 in the auxiliary branch 114 and the switch S6 in the auxiliary branch 124 is turned on. Therefore, during the read operation, one of the auxiliary branches 114 and 124 is turned on to assist the corresponding one of the inverters 112 and 122 in holding data. In the example in FIG. 1, the data $\overline{Q}$ is, for example, the logical high value which causes the switch S5 to be turned off and the data Q is, for example, the logical low value which causes the switch S6 to be turned on. Hence, the auxiliary branch 124 which couples the storage node SN2 to, for example, the supply rail VDD, assists the inverter 122 in holding data $\overline{Q}$.

Therefore, when the storage node SN1 is being charged by the bit line BL during the read operation, because the data $\overline{Q}$ at the storage node SN2 is held by the conducting branch of the inverter 122 and additionally by the auxiliary branch 124, an increase in a voltage of the storage node SN1 does not cause read disturb. Symmetrically, during a read operation of the storage nodes SN1 and SN2 storing, for example, the logical high value and the logical low value, respectively, because the data Q at the storage node SN1 is held additionally by the auxiliary branch 114, an increase in a voltage of the storage node SN2 does not cause read disturb. Therefore, a read static noise margin (RSNM), a measure of read stability of the SRAM cell 10, is enhanced.

During a read or write operation of an SRAM cell, because the word line WL controlling the pass gates of the SRAM cell also controls other SRAM cells in the same row, these other SRAM cells in the same row experience dummy read operations. Suppose the SRAM cell 10 in FIG. 1 is one of the other SRAM cells experiencing the dummy read operation. The column select signal YB is deasserted to indicate that a read or write operation is not being performed on the column where the SRAM cell 10 resides. Upon receiving the deasserted column select signal YB, the control logic 116 generates the signal to the write word line WWL based on the column select signal YB, and the control logic 126 generates the signal to the complementary word line WWLB based on the column select signal YB. Effectively, the signal through the write word line WWL and the signal through the complementary word line WWLB generated during the dummy read operation are the same as those generated in the read operation. Therefore, operations of the SRAM cell 10 during the dummy read operation are the same as those during the read operation and are omitted.

Compared to other approaches adopting the 8T 2-port SRAM cell, the SRAM cell 10 experiencing a dummy read operation caused by, for example, a write operation on another SRAM cell in the same row, is assisted in data holding by one of the auxiliary branches 112 and 124 and therefore, is harder to be affected by read disturb. Compared to other approaches adopting the 10T cross-point SRAM cell, the storage nodes SN1 and SN2 of the SRAM cell 10 are each accessed through a pass gate, and cross-point control is achieved through reducing the impact of a dummy read operation by applying one of the auxiliary branches to assist in holding data. Therefore, the SRAM cell 10 has a higher cell current for charging or discharging the storage node SN1 or SN2 during a read or write operation.

Referring to FIG. 3, in operation 304, during a write operation of the storage node SN1 and the storage node SN2, based on data WT and WC to be written to the storage nodes SN1 and SN2, respectively, one of the auxiliary branches 114 and 124 is caused to assist a corresponding one of the cross-coupled inverters 112 and 122 in flipping data Q or $\overline{Q}$.

During the write operation of the SRAM cell 10 illustratively shown in FIG. 3, the column select signal YB is asserted to reflect that a read or write operation is being performed on the column where the SRAM cell 10 resides. Upon receiving the asserted column select signal YB, the control logic 116 generates the signal applied to the write word line WWL based on the write data signal WT, and the control logic 126 generates the signal applied to the complementary word line WWLB based on the write data signal WC. One of the write data signal WT and the write data signal WC is asserted so that one of the auxiliary branches 112 and 122 is conducting. In some embodiments, the write data signal WT corresponds to the data to be written to the storage node SN1, and the write data signal WC corresponds to the data to be written to the storage node SN2.

In some embodiments, when the write operation initiates, the bit line BL and the complementary bit line BLB have been precharged, such as to the logical high value, by a precharging circuitry (not shown). The signal through the write word line WWL is deasserted with respect to the write switch WS1 of the bit line driver 118, and therefore, the write switch WS1 does not couple the bit line BL to, for example, ground, and the bit line BL stays at the precharged level. The signal through the complementary word line WWLB is asserted with respect to the write switch WS2 of the complementary bit line driver 128, and therefore, the write switch WS2 couples the complementary bit line BLB to, for example, ground. During the write operation, the word line WL is asserted such that the pass gate PG1 and PG2 couples the bit line BL and the complementary bit line BLB to the storage nodes SN1 and SN2, respectively.

Based on the write data signal WT, the signal through the write word line WWL is asserted with respect to the switch S3 in the auxiliary branch 114, and therefore turns on the switch S3. Based on the write data signal WC, the signal through the complementary word line WWLB is deasserted with respect to the switch S4 in the auxiliary branch 124, and therefore turns off the switch S4. Initially, based on the data Q and $\overline{Q}$ stored in the storage nodes SN1 and SN2, the switch S5 in the auxiliary branch 114 is turned off and the switch S6 is turned on. When the pass gates PG1 and the PG2 couples the storage nodes SN1 and SN2 to the bit line BL and the complementary bit line BLB, respectively, one of the storage nodes SN1 and SN2, such as the storage node SN2 begins discharging through the complementary bit line. At such time, the auxiliary branch 124 is turned off due to the opened switch S4, and therefore, contention in writing data to the storage node SN2 is from the conducting branch of the inverter 122. As the voltage at the storage node SN2 keeps transitioning to a level of the data to be written to the storage node SN2, the non-conducting branch of the inverter 122 becomes conducting and the switch S5 of the auxiliary branch 114 becomes conducting. Therefore, the auxiliary branch 114 assists the inverter 112 in flipping data Q.

When the storage node SN2 is first transitioning to the data to be written to the storage node SN2, the auxiliary branch 124 is turned off and does not cause contention in writing data to the storage node SN2. On the other hand, as the storage node SN2 keeps transitioning, the auxiliary branch 114 is turned on to assist the inverter 112 in writing data to the storage node SN1. Symmetrically, when the storage node SN1 is first transitioning to the data to be written to the storage node SN1, the auxiliary branch 114 is turned off and does not cause contention in writing data to the storage node SN1. On the other hand, as the storage node SN1 keeps transitioning, the auxiliary branch 124 is turned on to assist the inverter 124 in writing data to the storage node SN2. Therefore, a write recovery time of the SRAM cell 10 is reduced. The write recovery time is the time between a voltage of the word line WL reaching 50% of the value that the word line WL is asserted with to the later transitioning storage node of the SRAM cell is flipped.

Compared to other approaches adopting the 8T 2-port SRAM cell or the 10T cross-point SRAM cell, when writing data to the SRAM cell 10, one of the auxiliary branches 114 and 124 which can cause contention in writing data is turned off, and the other of the auxiliary branches 114 and 124 which assists in flipping data is turned on. Therefore, the write recovery time of the SRAM cell 10 is reduced because data flipping is being assisted with the auxiliary branch. Further, compared to the other approaches, a write margin of the SRAM cell 10 is increased because flipping data of the inverter 112 being assisted by the auxiliary branch 114 is easier.

Further, compared to the other approaches adopting the 8T 2-port SRAM cell, the SRAM cell 10 does not include a separate read circuitry in addition to the pass gates PG1 and PG2, and the bit line BL and the complementary bit line BLB. The auxiliary branches 114 and 124, and the write word line WWL and the complementary write word line WWLB of the SRAM cell 10 can be implemented using the space for the separate read circuitry in the 8T 2-port SRAM cell. Therefore, the SRAM cell 10 and the 8T 2-port SRAM cell have compatible areas.

Figure 4:
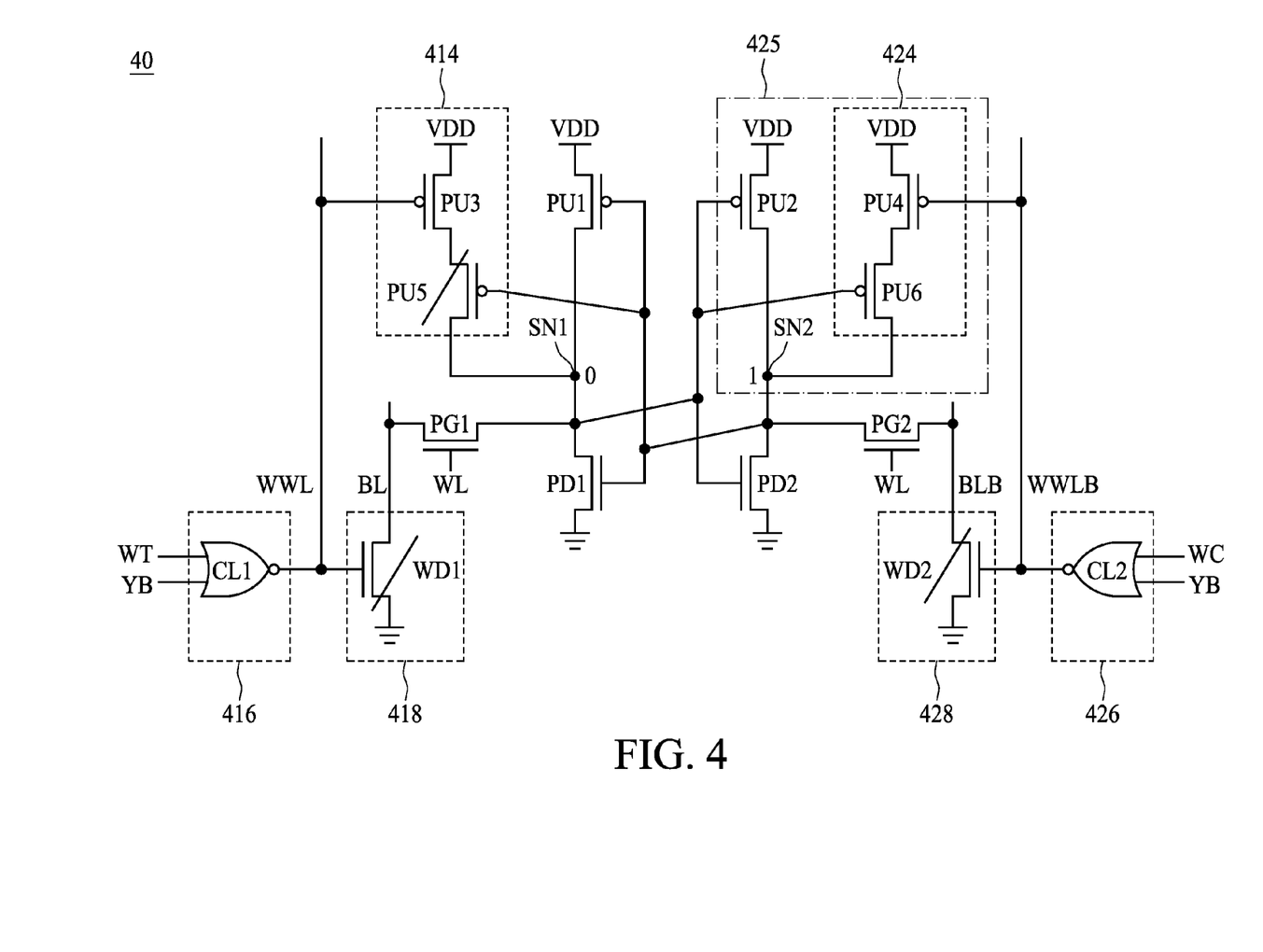
FIG. 4 is a schematic circuit diagram of an SRAM cell with data-controlled auxiliary pull-up branches during a read operation or a dummy read operation in accordance with some embodiments.

FIG. 4 is a schematic circuit diagram of an SRAM cell 10 with data-controlled auxiliary pull-up branches during a read operation or a dummy read operation in accordance with some embodiments. The SRAM cell 40 in FIG. 4 is an implementation of the SRAM cell 10 in FIG. 1. The SRAM cell 40 includes cross-coupled inverters (not labeled), auxiliary pull-up branches 414 and 424, control logic 416 and 426, pass gates PG1 and PG2, a bit line driver 418 and a complementary bit line driver 428. The cross-coupled inverters and the pass gates PG1 and PG2 are the same as those described with reference to FIG. 1 and are omitted here. In some embodiments, the bit line driver 418 and the complementary bit line driver 428 are shared between SRAM cells in the same column.

The auxiliary branches 418 and 428 are coupled to the storage node SN1 and the storage node SN2, respectively. In some embodiments, the auxiliary branch 414 includes a pFET PU3 and a pFET PU5 coupled in series between the storage node SN1 and the supply rail VDD. The pFET PU3 is in response to a signal through a write word line WWL. The pFET PU5 is in response to the data stored in the storage node SN2. Similarly, the auxiliary branch 424 includes a pFET PU4 and a pFET PU6 coupled in series between the storage node SN2 and the supply rail VDD. The pFET PU4 is in response to a signal through a complementary write word line WWLB. The pFET PU6 is in response to the data stored in the storage node SN1. In other embodiments, the pFET PU5 receiving the data in the storage node SN1 is arranged closer to the supply rail VDD and the pFET PU3 receiving the signal through the write word line WWL is arranged closer to the storage node SN1.

The control logic 416 and 426 generate the signal to the write word line WWL and the signal to the complementary write word line WWLB, respectively. The control logic 416 includes a NOR gate CL1. One of inputs of the NOR gate CL1 receives a write data signal WT, and the other of the inputs of the NOR gate CL1 receives a column select signal YB, and the output of the NOR gate CL1 is coupled to the write word line WWL. Similarly, the control logic 426 includes a NOR gate CL2. One of inputs of the NOR gate CL2 receives a write data signal WC, and the other of the inputs of the NOR gate CL2 receives the column select signal YB, and the output of the NOR gate CL2 is coupled to the complementary write word line WWLB.

The bit line driver 418 and the complementary bit line driver 428 driving the bit line BL and the complementary bit BLB, respectively, are also controlled by the write word line WWL and the complementary write word line WWLB. The bit line driver 418 includes an nFET WPD1 coupled between the bit line BL and the ground. The complementary bit line driver 428 includes an nFET WPD2 coupled between the complementary bit line BLB and the ground.

Figure 5:
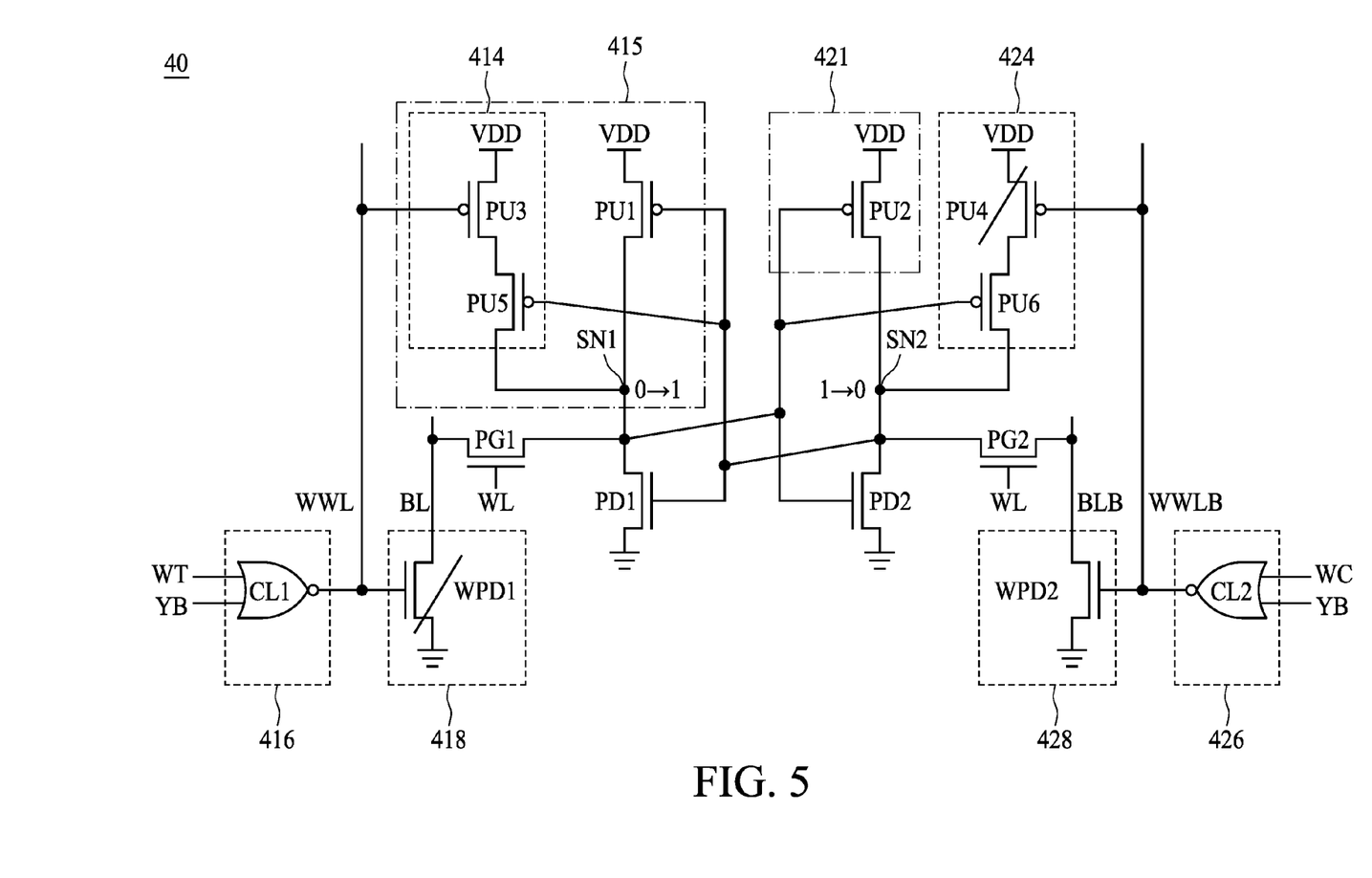
FIG. 5 is a schematic circuit diagram of the SRAM cell with data-controlled auxiliary pull-up branches during a write operation in accordance with some embodiments.

FIG. 5 is a schematic circuit diagram of the SRAM cell 40 with data-controlled auxiliary pull-up branches during a write operation in accordance with some embodiments. The structure of the SRAM cell 40 in FIG. 5 is similar to that described with reference to FIG. 4 and is therefore omitted here. FIG. 4 and FIG. 5 illustrate different operations of the SRAM cell 40 which are described in further detail below.

Figure 6:
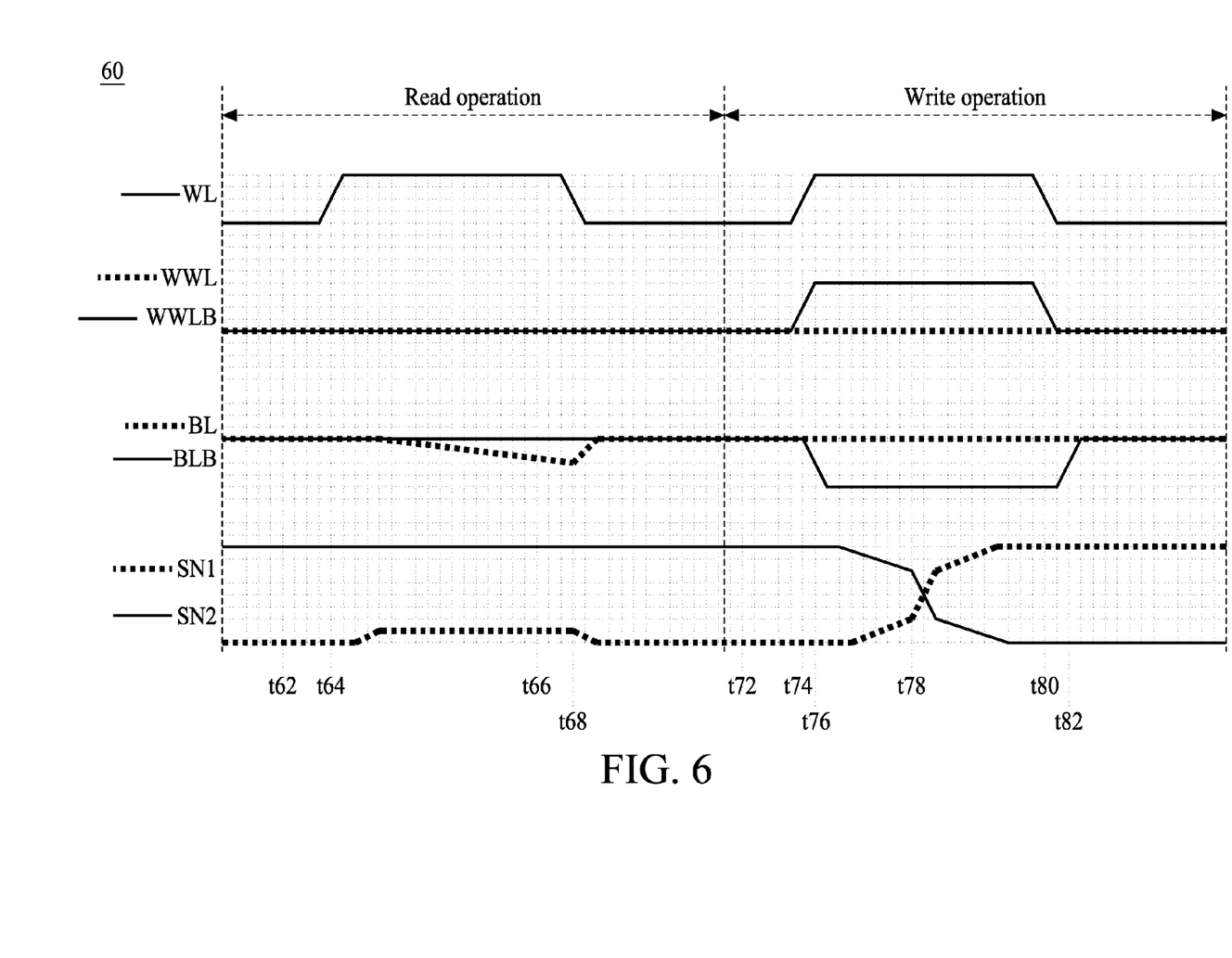
FIG. 6 is a timing diagram of signals of the SRAM cell in FIG. 4 and FIG. 5 during a read operation, a dummy read, and a write operation.

FIG. 6 is a timing diagram 60 of signals of the SRAM cell 40 during a read operation, a dummy read, and a write operation. A read operation portion of the timing diagram 60 illustrates signals in the SRAM cell 40 in FIG. 4.

At time t62, before a read operation commences, the word line WL is not yet asserted with the logical high value. The bit line BL and the complementary bit line BLB are precharged to the logical high value. The data stored at the storage node SN1 and the storage node SN2 are the logical low value and the logical high value, respectively.

At time t64, when the read operation initiates, the word line WL is asserted with the logical high value. The column select signal YB input to the NOR gate CL1 and the NOR gate CL2 is asserted with the logical low value to reflect that the column where the SRAM cell 10 resides is selected. With the asserted column select signal YB, the outputs of the NOR gate CL1 and the NOR gate CL2 are determined by the write data signal WT and the write data signal WC, respectively. The write data signal WT has the logical high value, and therefore, the output of the NOR gate CL1 coupled to the write word line WWL is asserted with the logical low value with respect to the pFET PU3. Similarly, the write data signal WC has the logical high value and therefore the output of the NOR gate CL2 coupled to the complementary write word line WWLB is asserted with the logical low value with respect to the pFET PU4. Because the data stored at the storage node SN1 and the storage node SN2 are the logical low value and the logical high value, respectively, the pFET PU6 is turned on while the pFET PU5 is turned off. Therefore, the auxiliary pull-up branch 424 is conducting. After the pass gates PG1 and PG2 are turned on at time t64, the bit line BL starts charging the storage node SN1, and therefore, a voltage of the storage node SN1 rises. The rise in the voltage of the storage node SN1 causes the nFET PD2 to be slightly turned on. Because a pull-up network 425 coupled to the storage node SN2 for holding the logical high value stored at the storage node SN2 includes both the pFET PU2 and the auxiliary pull-up branch 424, the slightly turned-on nFET PD2 cannot flip the data stored at the storage node SN2.

At time t66, when the bit line BL drops to a value where a difference in voltages of the bit line BL and the complementary bit line BLB is sensed by a sense amplifier (not shown), the data stored at the SRAM cell 40 is read.

At time t68, the word line WL is deasserted with the logical low value, which indicates that the read operation is completed. The bit line BL and the complementary bit line BLB starts to be restored to the precharged level.

A dummy read operation on the SRAM cell 40 occurred during a read or write operation of another SRAM cell has the same signal transitions as the read operation portion in the timing diagram 60 and is omitted here.

A write operation portion of the timing diagram 60 illustrates signals in the SRAM cell 40 in FIG. 5. At time 72, before a write operation commences, the word line WL is not yet asserted the logical high value. The bit line BL and the complementary bit line BLB are precharged to the logical high value. The data stored at the storage node SN1 and the storage node SN2 are the logical low value and the logical high value, respectively.

At time t74, when the write operation initiates, the word line WL is asserted with the logical high value. The column select signal YB input to the NOR gate CL1 and the NOR gate CL2 is asserted with the logical low value to reflect that the column where the SRAM cell 10 resides is selected. With the asserted column select signal YB, the outputs of the NOR gate CL1 and the NOR gate CL2 are determined by the write data signal WT and the write data signal WC, respectively. The write data signal WT and the write data signal WC have values corresponding to the data to be written to the storage nodes SN1 and SN2. The write data signal WT to the input of the NOR gate CL1 has the logical high value, and therefore, the output of the NOR gate CL1 coupled to the write word line WWL is asserted with the logical low value with respect to the pFET PU3. The write data signal WC to the input of the NOR gate CL2 is the logical low value, and therefore, the output of the NOR gate CL2 coupled to the complementary write word line WWLB is deasserted with the logical high value with respect to the pFET PU4. Because the data stored at the storage node SN1 and the storage node SN2 are initially the logical low value and the logical high value, the pFET PU5 is turned on and the pFET PU6 is turned off. Therefore, the auxiliary branches 414 and 424 are not conducting.

At time t76, because the logical low value of the signal through the write word line WWL is deasserted with respect to the nFET WPD1, and the logical high value of the signal through the complementary write word line WWLB is asserted with respect to the nFET WPD2, the bit line BL stays at the logical high value and the complementary bit line BLB is being pulled down to the logical low value.

After the pass gate PG2 is turned on at time t74 and the complementary bit line BLB is pulled down to the logical low value at time t76, the storage node SN2 starts discharging through the nFET WPD2. Because the auxiliary branch 424 is not conducting due to the turned off pFET PU4, a pull-up network 421 holding the logical high value stored at the storage node SN2 includes the pFET PU2 but does not include the auxiliary branch 424.

As a voltage of the storage node SN2 keeps dropping, at time t78, the pFET PU1 of the inverter and the pFET PU5 are turned on. A pull-up network 415 for flipping the data stored at the storage node SN1 includes the pFET PU1 and the auxiliary pull-up branch 414. With the assistance of the auxiliary pull-up branch 414, the speed in flipping data of the SRAM cell 10 is increased. Therefore, the voltage of the storage node SN1 rises at a higher rate. As the storage node SN1 approaches the logical high value, the rising rate decreases, and the increase in the voltage stops when the storage node SN1 reaches the logical high value. Correspondingly, the voltage of the storage node SN2 drops at a higher rate. As the storage node SN2 approaches the logical low value, the dropping rate decreases, and the decrease in the voltage stops when the storage node SN2 reaches the logical low value.

At time t80, the word line WL is deasserted with the logical low value, which indicates that the write operation is completed. At time t82, the bit line BL and the complementary bit line BLB are being restored to the precharged level.

Figure 7:
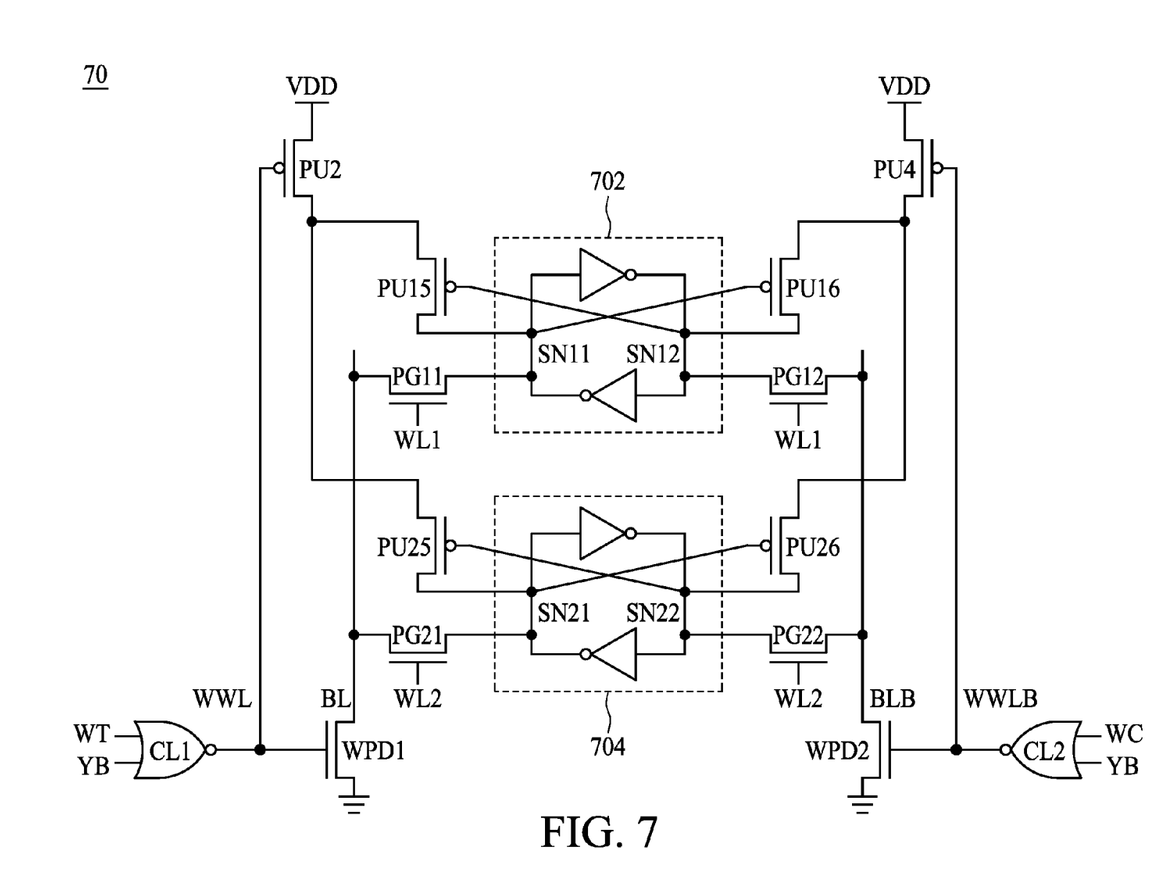
FIG. 7 is a schematic circuit diagram of SRAM cells in the same column sharing transistors in the auxiliary branches in accordance with some embodiments.

FIG. 7 is a schematic circuit diagram of SRAM cells 70 in the same column sharing transistors in the auxiliary branches in accordance with some embodiments. The SRAM cells 70 in the same column includes a first SRAM cell, a second SRAM cell and components shared between the first SRAM cell and the second SRAM cell. The first SRAM cell includes a pair of cross-coupled inverters 702, pass gates PG11 and PG12 and pFETs PU15 and PU16. The second SRAM cell includes a pair of cross-coupled inverters 704, pass gates PG21 and PG22 and pFETs PU25 and PU26. Components shared between the first SRAM cell and the second SRAM cell includes pFETs PU2 and PU4, control logic CL1 and CL2, and a bit line driver WPD1 and a complementary bit line driver WPD2.

In the first SRAM cell, the cross-coupled inverters 702 form storage nodes SN1 and SN2. The shared pFET PU2 and the pFET PU15 form an auxiliary branch coupled to the storage node SN11. The pFET PU2 is controlled by a write word line WWL driven by the shared control logic CL1. The pFET PU15 is controlled by data stored at the storage node SN12. The shared pFET PU4 and the pFET PU16 form another auxiliary branch coupled to the storage node SN12. The pFET PU4 is controlled by a complementary write word line WWLB driven by the shared control logic CL2. The pass gate PG11 couples the bit line BL to the storage node SN11. The bit line BL is driven by the shared bit line driver WPD1. The pass gate PG12 couples the complementary bit line BLB to the storage node SN12. The complementary bit line BLB is driven by the shared bit line driver WPD2. The operations of the auxiliary branches of the first SRAM cell during a read operation, a dummy read operation and a write operation are similar to those described with reference to FIGS. 4 to 6 and are omitted here.

In the second SRAM cell, the cross-coupled inverters 704 form storage nodes SN21 and SN22. The shared pFET PU2 and the pFET PU25 form an auxiliary branch coupled to the storage node SN21. The pFET PU2 is controlled by the write word line WWL driven by the shared control logic CL1. The pFET PU25 is controlled by data stored at the storage node SN22. The shared pFET PU4 and the pFET PU26 form another auxiliary branch coupled to the storage node SN22. The pFET PU4 is controlled by the complementary write word line WWLB driven by the shared control logic CL2. The pass gate PG21 couples the bit line BL to the storage node SN21. The bit line BL is driven by the shared bit line driver WPD1. The pass gate PG22 couples the complementary bit line BLB to the storage node SN22. The complementary bit line BLB is driven by the shared bit line driver WPD2. The operations of the auxiliary branches of the second SRAM cell during a read operation, a dummy read operation and a write operation are similar to those described with reference to FIGS. 4 to 6 and are omitted here.

In some embodiments, a method includes: during a read operation of a first storage node and a second storage node formed by cross-coupled inverters, based on data stored in the first storage node and the second storage node, causing a first auxiliary branch or a second auxiliary branch to assist a corresponding one of the cross-coupled inverters in holding data; and during a write operation of the first storage node and the second storage node, based on data to be written to the first storage node and the second storage node, causing the first auxiliary branch or the second auxiliary branch to assist a corresponding one of the cross-coupled inverters in flipping data.

In some embodiments, a method includes: providing a first inverter; cross-coupling a second inverter with the first inverter to form a first storage node and a second storage node; coupling a first auxiliary branch to the first storage node for assisting the first inverter in holding data based on data stored at the second storage node during a read operation, and assisting the first inverter in flipping data based on data to be written to the first storage node during a write operation; and coupling a second auxiliary branch to the second storage node and for assisting the second inverter in holding data based on data stored at the first storage node during the read operation, and assisting the second inverter in flipping data based on data to be written to the second storage node during the write operation.

In some embodiments, a method includes: providing a first inverter; cross-coupling a second inverter with the first inverter to form a first storage node and a second storage node; to arranging a first auxiliary branch to have a first transistor and a second transistor connected in series and coupled to the first storage node; arranging the first transistor to be controlled by a first signal asserted during a read operation of the first storage node and the second storage node, and asserted based on data to be written to the first storage node; arranging the second transistor to be controlled by data stored at and/or data being stored at the second storage node; arranging a second auxiliary branch to have a third transistor and a fourth transistor and coupled to the second storage node; arranging the third transistor to be controlled by a second signal asserted during the read operation of the first storage node and the second storage node, and asserted based on data to be written to the second storage node; and arranging the fourth transistor to be controlled by data stored at and/or data being stored at the first storage node.

The above description includes exemplary operations, but these operations are not necessarily required to be performed in the order shown. Operations may be added, replaced, changed order, and/or eliminated as appropriate, in accordance with the spirit and scope of the disclosure. Accordingly, the scope of the disclosure should be determined with reference to the following claims, along with the full scope of equivalences to which such claims are entitled.

What is claimed is:

1. A method, comprising:
    during a read operation of a first storage node and a second storage node formed by cross-coupled inverters, turning on a first transistor in a first auxiliary branch and a second transistor in a second auxiliary branch, turning on a third transistor cascoded with the first transistor in the first auxiliary branch based on data stored in the second storage node for charging the first storage node to hold data on the first storage node, and turning off a fourth transistor cascoded with the second transistor in the second auxiliary branch based on data stored in the first storage node; and
    during a write operation of the first storage node and the second storage node, arranging data to be written to the first storage node to control the second transistor in the second auxiliary branch, and arranging data to be written to the second storage node to control the first transistor in the first auxiliary branch to assist a corresponding one of the cross-coupled inverters in flipping data.

2. The method according to claim 1, wherein the read operation further comprises:
    generating a first signal or a second signal which is asserted during the read operation; and
    applying the first signal or the second signal and the data stored at the second storage node or the first storage node to the first auxiliary branch or the second auxiliary branch.

3. The method according to claim 2, further comprising:
    applying the first signal or the second signal to a first data line driver or a second data line driver which drives a first data line or a second data line coupled to the first storage node or the second storage node through a first pass gate or a second pass gate,
    the first data line driver being deactivated when the first signal is asserted with respect to the first auxiliary branch, or the second data line driver being deactivated when the second signal is asserted with respect to the second auxiliary branch.

4. The method according to claim 1, wherein the write operation further comprises:
    generating a first signal or a second signal which is asserted corresponding to data to be written to the first storage node or the second storage node; and
    applying the first signal or the second signal and the data stored at the second storage node or the first storage node to the first auxiliary branch or the second auxiliary branch.

5. The method according to claim 4, further comprising:
    applying the first signal or the second signal to a first data line driver or a second data line driver which drives a first data line or a second data line coupled to the first storage node or the second storage node through a first pass gate or a second pass gate,
    the first data line driver being activated when the first signal is deasserted with respect to the first auxiliary branch, or the second data line driver being activated when the second signal is deasserted with respect to the second auxiliary branch.

6. The method according to claim 1, further comprising:
    during a dummy read operation of the first storage node and the second storage node, based on data stored in the first storage node and the second storage node, causing one of the first auxiliary branch and the second auxiliary branch to assist a corresponding one of the cross-coupled inverters in holding data.

7. The method according to claim 6, wherein during the dummy read operation of the first storage node and the second storage node, based on data stored in the first storage node and the second storage node, causing one of the first auxiliary branch and the second auxiliary branch to assist a corresponding one of the cross-coupled inverters in holding data comprises:
    generating a column select signal which is deasserted during the dummy read operation;
    generating a first signal or a second signal which is asserted when a column select signal is deasserted; and
    applying the first signal or the second signal and the data stored at the second storage node or the first storage node to the first auxiliary branch or the second auxiliary branch.

8. A method, comprising:
    providing a first inverter;
    cross-coupling a second inverter with the first inverter to form a first storage node and a second storage node;
    coupling a first auxiliary branch to the first storage node by turning on a first transistor in the first auxiliary branch and turning on a second transistor cascoded with the first transistor in the first auxiliary branch based on data stored at the second storage node for charging the first storage node to hold data on the first storage node during a read operation, and arranging data to be written to the second storage node to control the first transistor of the first auxiliary branch to assist the first inverter in flipping data during a write operation; and
    coupling a second auxiliary branch to the second storage node by turning on a third transistor in the second auxiliary branch and turning off a fourth transistor cascoded with the third transistor in the second auxiliary branch based on data stored at the first storage node during the read operation, and arranging data to be written to the first storage node to control the third transistor of the second auxiliary branch to assist the second inverter in flipping data.

9. The method according to claim 8, further comprising:
    arranging the first transistor of the first auxiliary branch and the third transistor of the second auxiliary branch to be controlled by a first signal and a second signal respectively which are asserted during the read operation, and/or are asserted based on the data to be written to the first storage node or the second storage node during the write operation; and
    arranging the second transistor of the first auxiliary branch and the fourth transistor of the second auxiliary branch to be controlled by the data stored at and/or data being stored at the second storage node and the first storage node respectively.

10. The method according to claim 9, further comprising:
arranging the first transistor and the second transistor of the first auxiliary branch or second auxiliary branch to be p-channel field effect transistors (pFETs);
arranging the first transistor to be turned on by the first signal or the second signal asserted with a low logical value during the read operation, and/or asserted when the data to be written to the first storage node or the second storage node is a logical high value; and
arranging the second transistor to be turned on by the logical low value stored at and/or data being stored at the second storage node or the first storage node.

11. The method according to claim 9, further comprising:
asserting the first signal or the second signal when a column select signal is deasserted.

12. The method according to claim 11, further comprising:
arranging a first NOR gate or a second NOR gate to receive a first write data signal or a second write data signal and the column select signal and generate the first signal or the second signal;
wherein the first write data signal or the second write data signal is asserted during the read operation and/or asserted based on the data to be written to the first storage node or the second storage node.

13. The method according to claim 9, further comprising:
arranging a first pass gate to couple between the first storage node and a first data line;
arranging a first data line driver to drive the first data line, and to be deactivated when the first signal is asserted with respect to the first transistor during the read operation and/or deactivated when the first signal is asserted or activated when the first signal is deasserted with respect to the first transistor during the write operation;
arranging a second pass gate to couple to the second storage node and a second data line; and
arranging a second data line driver to drive the second data line, and to be deactivated when the second signal is asserted with respect to the third transistor during the read operation and/or deactivated when the second signal is asserted or activated when the second signal is deasserted with respect to the third transistor during the write operation.

14. The method according to claim 8, further comprising:
arranging a first pass gate to couple to the first storage node and a first data line, and to be used for the read operation and/or the write operation; and
arranging a second pass gate to couple to the second storage node and a second data line, and to be used for the read operation and/or the write operation.

15. A method, comprising:
providing a first inverter;
cross-coupling a second inverter with the first inverter to form a first storage node and a second storage node;
arranging a first auxiliary branch to have a first transistor and a second transistor cascoded with the first transistor, and the second transistor coupled to the first storage node;
arranging the first transistor to be turned on by a first signal asserted during a read operation of the first storage node and the second storage node, and arranging data to be written to the second storage node to control the first transistor during a write operation;
arranging the second transistor to be controlled by data stored at and/or data being stored at the second storage node;
arranging a second auxiliary branch to have a third transistor and a fourth transistor cascoded with the third transistor, and the fourth transistor coupled to the second storage node;
arranging the third transistor to be turned on by a second signal asserted during the read operation of the first storage node and the second storage node, and arranging data to be written to the first storage node to control the third transistor during the write operation; and
arranging the fourth transistor to be controlled by data stored at and/or data being stored at the first storage node.

16. The method according to claim 15, further comprising:
arranging the first transistor or the third transistor, and the second transistor or the fourth transistor to be pFETs;
arranging the first transistor or the third transistor to be turned on by the first signal or the second signal asserted with a logical low value during the read operation, and/or is asserted when the data to be written to the first storage node or the second storage node is a logical high value during the write operation; and
arranging the second transistor or the fourth transistor to be turned on by the logical low value stored at and/or being stored at the second storage node or the first storage node.

17. The method according to claim 15, further comprising:
asserting the first signal or the second signal when a column select signal is deasserted.

18. The method according to claim 17, further comprising:
arranging a first NOR gate or a second NOR gate to receive a first write data signal or a second write data signal and the column select signal and generate the first signal or the second signal;
wherein the first write data signal or the second write data signal is asserted during the read operation and/or asserted based on the data to be written to the first storage node or the second storage node.

19. The method according to claim 15, further comprising:
arranging a first pass gate to couple between the first storage node and a first data line;
arranging a first data line driver to drive the first data line, and to be deactivated when the first signal is asserted with respect to the first transistor during the read operation and/or deactivated when the first signal is asserted or activated when the first signal is deasserted with respect to the first transistor during the write operation;
arranging a second pass gate to couple to the second storage node and a second data line; and
arranging a second data line driver to drive the second data line, and to be deactivated when the second signal is asserted with respect to the third transistor during the read operation and/or deactivated when the second signal is asserted or activated when the second signal is deasserted with respect to the third transistor during the write operation.

20. The method according to claim 15, further comprising:
arranging a first pass gate to couple to the first storage node and a first data line, and to be used for the read operation and/or the write operation; and arranging a second pass gate to couple to the second storage node and a second data line, and to be used for the read operation and/or the write operation.

* * * * *